United States Patent
Lee et al.

(10) Patent No.: US 9,520,416 B2
(45) Date of Patent: Dec. 13, 2016

(54) THIN FILM TRANSISTOR ARRAY SUBSTRATE AND MANUFACTURING METHOD THEREOF

(71) Applicant: Samsung Display Co., Ltd., Yongin, Gyeonggi-Do (KR)

(72) Inventors: Jun Seok Lee, Seoul (KR); Su Wan Woo, Osan-si (KR); Do Yeong Park, Seoul (KR); Chang Il Tae, Seoul (KR); Sang Woo Whangbo, Seoul (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/698,223

(22) Filed: Apr. 28, 2015

(65) Prior Publication Data

US 2016/0141307 A1 May 19, 2016

(30) Foreign Application Priority Data

Nov. 17, 2014 (KR) ........................ 10-2014-0160090

(51) Int. Cl.
*H01L 27/12* (2006.01)
*G02F 1/1335* (2006.01)
*H01L 29/786* (2006.01)
*H01L 29/66* (2006.01)
*G02F 1/1362* (2006.01)

(52) U.S. Cl.
CPC ....... *H01L 27/124* (2013.01); *G02F 1/133516* (2013.01); *H01L 27/1222* (2013.01);
(Continued)

(58) Field of Classification Search
CPC ............. H01L 27/124; H01L 29/66969; H01L 29/7869; H01L 29/78678; H01L 29/66765; H01L 29/78669; H01L 29/78666; H01L 29/78675; H01L 27/1222; H01L 29/66757; G02F 1/133516; G02F 1/123227
See application file for complete search history.

(56) References Cited

U.S. PATENT DOCUMENTS 7,605,535 B2 * 10/2009 Kobayashi .......... H01L 27/3211
    313/112
9,025,112 B2 * 5/2015 Xu ..................... G02F 1/133512
    349/106
(Continued)

FOREIGN PATENT DOCUMENTS

JP    2004-317889 A    11/2004
KR    2003-0018619 A    3/2003
(Continued)

*Primary Examiner* — William Coleman
(74) *Attorney, Agent, or Firm* — Robert E. Bushnell, Esq.

(57) ABSTRACT

A method of manufacturing an array substrate includes applying a first color filter and a second color filter over a first and second pixel regions respectively and the color filters have an overlapped portion in wiring region; and forming a contact hole, which partially exposes the drain electrode therethrough, by etching at least one of the overlapping first and the second color filters, and the forming the contact hole includes selectively etching an upper part of the overlapped portion during etching a photoresist layer covering the overlapped portion, the overlapped portion of first and second color filters is etched without requiring an additional masking process, preventing a decrease of liquid crystal margin due to large height difference of the overlapped color filters, preventing misalignment of color filters and mixing of colors.

20 Claims, 25 Drawing Sheets

(52) U.S. Cl.
CPC .... *H01L 27/1259* (2013.01); *H01L 29/66757* (2013.01); *H01L 29/66765* (2013.01); *H01L 29/66969* (2013.01); *H01L 29/7869* (2013.01); *H01L 29/78666* (2013.01); *H01L 29/78669* (2013.01); *H01L 29/78675* (2013.01); *H01L 29/78678* (2013.01); *G02F 1/136227* (2013.01); *G02F 2001/136222* (2013.01)

(56) References Cited

U.S. PATENT DOCUMENTS

| | | | |
|---|---|---|---|
| 2014/0098332 A1* | 4/2014 | Kim | G02F 1/133512 349/106 |
| 2015/0185551 A1* | 7/2015 | Kim | G02F 1/133516 349/110 |
| 2015/0200211 A1* | 7/2015 | Hong | H01L 27/1222 349/43 |
| 2015/0261029 A1* | 9/2015 | Park | G02F 1/13394 349/106 |

FOREIGN PATENT DOCUMENTS

| | | |
|---|---|---|
| KR | 10-2005-0052690 A | 6/2005 |
| KR | 10-2005-0052732 A | 6/2005 |
| KR | 10-2007-0035667 A | 4/2007 |
| KR | 10-2011-0088215 A | 8/2011 |
| KR | 10-2011-0100842 A | 9/2011 |
| KR | 10-2013-0137457 A | 12/2013 |

* cited by examiner

THIN FILM TRANSISTOR ARRAY SUBSTRATE AND MANUFACTURING METHOD THEREOF

This application claims the priority to and all the benefits accruing under 35 U.S.C. §119 from Korean Patent Application No. 10-2014-0160090 filed on Nov. 17, 2014 in the Korean Intellectual Property Office ("KIPO"), the disclosure of which is incorporated herein by reference in its entirety.

BACKGROUND OF THE INVENTION

1. Field of the Invention

The invention relates to an array substrate and a manufacturing method thereof.

2. Description of the Related Art

Many existing display devices have been replaced with thin, flat panel display devices such as liquid crystal display (LCD) devices or organic light-emitting diode (OLED) display devices.

An LCD device, which is a type of flat panel display device, includes two substrates where two opposing electrodes are formed and a liquid crystal layer which is interposed between the two substrates. The LCD device displays an image by applying a voltage to the two opposing electrodes so as to realign liquid crystal molecules in the liquid crystal layer and thus to adjust the amount of light transmitted through the liquid crystal layer.

The two opposing electrodes may both be formed on one of the two substrates. Red, green, and blue color filters may be formed on one of the two substrates to realize colors on a screen. In many of the latest monitors or televisions (TVs), the thickness of color filters is increased to improve color reproducibility.

However, in a case when color filters are formed thick, a large height difference may be formed in areas where the color filters overlap. As a result, the alignment of liquid crystal molecules in the liquid crystal layer may be varied, and thus, disclination may be caused.

Especially when a black matrix and a color spacer are formed in an area where there is a large height difference, a liquid crystal margin defined as a gap between the overlapped color filters and an opposing electrode may decrease due to the large height difference.

SUMMARY OF THE INVENTION

Exemplary embodiments of the invention provide a method of manufacturing an array substrate, which is capable of securing a liquid crystal margin.

However, exemplary embodiments of the invention are not restricted to those set forth herein. The above and other exemplary embodiments of the invention will become more apparent to one of ordinary skill in the art to which the invention pertains by referencing the detailed description of the invention given below.

According to an exemplary embodiment of the invention, a method of manufacturing an array substrate, which includes, on a substrate, a plurality of gate lines that extend in a first direction, a plurality of data lines that extend in a second direction, and a plurality of pixel regions that are defined by the plurality of gate lines and the plurality of data lines, comprises: forming a gate electrode and a gate line, which is electrically connected to the gate electrode, on the substrate; forming a gate insulating layer on an entire surface of the substrate where the gate line is formed; forming a semiconductor layer on the gate insulating layer in an area that at least partially overlaps the gate electrode; forming a data line, which includes source and drain electrodes that at least partially overlap the semiconductor layer and is electrically connected to the source and drain electrodes; applying a first color filter over a first pixel region on the substrate where the data line is formed and applying a second color filter over a second pixel region that is near the first pixel region; and forming a contact hole, which partially exposes the drain electrode therethrough, by etching at least one of the first color filter and the second color filter, wherein the first color filter and the second color filter have an overlapped portion, which is relatively thick at the boundary between the first pixel region and the second pixel region, and the forming the contact hole includes selectively etching an upper part of the overlapped portion.

The forming the contact hole further may include forming a photoresist layer on the substrate where the first color filter and the second color filter are formed, and the photoresist layer may be relatively thinner on the overlapped portion than on the first color filter in the first pixel region or on the second color filter in the second pixel region.

The forming the contact hole may include selectively etching the upper part of the overlapped portion with the use of a dry etching method.

The first color filter and the second color filter are of different colors.

The method may further comprise forming a pixel electrode, which is connected to the drain electrode through the contact hole, on at least one of the first color filter and the second color filter.

According to another exemplary embodiment of the invention, a method of manufacturing an array substrate, which includes, on a substrate, a plurality of gate lines that extend in a first direction, a plurality of data lines that extend in a second direction, and a plurality of pixel regions that are defined by the plurality of gate lines and the plurality of data lines, comprise: forming a semiconductor layer on the substrate; forming an insulating layer on the substrate where the semiconductor layer is formed; forming a gate electrode and a gate line, which is electrically connected to the gate electrode, on the insulating layer in an area that at least partially overlaps the semiconductor layer; forming a gate insulating layer on an entire surface of the substrate where the gate line is formed; forming at least one first contact hole, which at least partially exposes the semiconductor layer therethrough, by etching the gate insulating layer and the insulating layer; forming a data line, which includes source and drain electrodes that are connected to the semiconductor layer, on the gate insulating layer where the first contact hole is formed; applying a first color filter over a first pixel region on the substrate where the data line is formed and applying a second color filter over a second pixel region that is near the first pixel region; and forming a second contact hole, which partially exposes the drain electrode therethrough, by etching at least one of the first color filter and the second color filter, wherein the first color filter and the second color filter have an overlapped portion, which is relatively thick at the boundary between the first pixel region and the second pixel region and, and the forming the second contact hole includes selectively etching an upper part of the overlapped portion.

The forming the second contact hole may further include forming a photoresist layer on the substrate where the first color filter and the second color filter are formed, and the photoresist layer may be relatively thinner on the overlapped portion than on the first color filter in the first pixel region or on the second color filter in the second pixel region.

The forming the second contact hole may include selectively etching the upper part of the overlapped portion with the use of a dry etching method.

The first color filter and the second color filter are of different colors.

The method may further comprise forming a pixel electrode, which is connected to the drain electrode through the second contact hole, on at least one of the first color filter and the second color filter.

According to another exemplary embodiment of the invention, a method of manufacturing an array substrate, which includes, on a substrate, a plurality of gate lines that extend in a first direction, a plurality of data lines that extend in a second direction, and a plurality of pixel regions that are defined by the plurality of gate lines and the plurality of data lines, comprise: forming a semiconductor layer on the substrate; forming a first insulating layer on the substrate where the semiconductor layer is formed; forming a gate electrode and a gate line, which is electrically connected to the gate electrode, on the first insulating layer in an area that at least partially overlaps the semiconductor layer; applying a first color filter over a first pixel region on the substrate where the gate electrode and the gate line are formed and applying a second color filter over a second pixel region that is near the first pixel region; forming at least one first contact hole, which partially exposes the semiconductor layer therethrough, by etching at least one of the first color filter and the second color filter; and forming a data line, which includes source and drain electrodes that are connected to the semiconductor layer through the first contact hole, on at least one of the first color filter and the second color filter, wherein the first color filter and the second color filter have an overlapped portion, which is relatively thick at the boundary between the first pixel region and the second pixel region and, and the forming the first contact hole includes selectively etching an upper part of the overlapped portion.

The forming the first contact hole may further include forming a photoresist layer on the substrate where the first color filter and the second color filter are formed, and the photoresist layer may be relatively thinner on the overlapped portion than on the first color filter in the first pixel region or on the second color filter in the second pixel region.

The forming the first contact hole may include selectively etching the upper part of the overlapped portion with the use of a dry etching method.

The first color filter and the second color filter are of different colors.

The method may further comprise forming a second insulating layer on the entire surface of the substrate where the data line is formed; forming a second contact hole, which partially exposes the drain electrode therethrough, on the second insulating layer; and forming a pixel electrode, which is connected to the drain electrode through the second contact hole.

According to an exemplary embodiment of the invention, an array substrate, comprises: a substrate; a plurality of gate lines extended in a first direction on the substrate; a plurality of data lines extended in a second direction on the substrate; a plurality of thin-film transistors (TFTs) being electrically connected to the gate lines and the data lines; and a plurality of pixel regions defined by the gate lines and the data lines, wherein a first color filter is disposed in a first pixel region, a second color filter is disposed in a second pixel region near the first pixel region, and the first color filter and the second color filter have an overlapped portion at the boundary between the first pixel region and the second pixel region, and have different thicknesses from each other in the overlapped portion.

The overlap portion may be 10% to 30% thicker than a spread portion of the first color filter and the second color filter.

The TFTs may be of a bottom gate type and the first color filter and the second color filter are disposed between one of the data lines and a pixel electrode.

The TFTs may be of a top gate type and the first color filter and the second color filter are disposed between one of the data lines and a pixel electrode.

The TFTs may be of a top gate type and the first color filter and the second color filter are disposed between one of the gate lines and one of the data lines.

According to the exemplary embodiments, it is possible to facilitate the injection of a liquid crystal material and improve the uniformity of the spread of the liquid crystal material.

Other features and exemplary embodiments will be apparent from the following detailed description, the drawings, and the claims.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
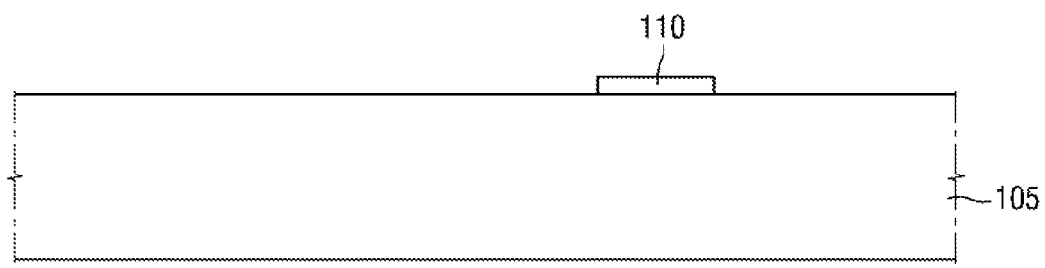
FIGS. 1 to 8 are cross-sectional views illustrating a method of manufacturing an array substrate, according to an exemplary embodiment of the invention.

Features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

In the drawings, the thickness of layers and regions are exaggerated for clarity. It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

Like numbers refer to like elements throughout. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Also, the terms "lower substrate" or "upper substrate" include, respectively, a first substrate or a second substrate and all the constituent elements formed on the first substrate or the second substrate.

Hereinafter, embodiments of the present invention will be described with reference to the accompanying drawings.

FIGS. 1 to 8 are cross-sectional views illustrating a method of manufacturing an array substrate, according to an exemplary embodiment of the invention. For convenience, the method of manufacturing an array substrate, according to an exemplary embodiment of the invention, will hereinafter be described with reference to FIGS. 1 to 8 and with further reference to FIG. 21.

Referring to FIG. 1, a gate line 115 may be formed on a substrate 105 in one direction. A gate electrode 110, which extends from, and is connected to, the gate line 115, may be formed.

The substrate 105 may be formed of an insulating material. The substrate 105 may be formed of a transparent material such as glass or a plastic material.

The gate electrode 110 and the gate line 115 may be formed by forming a conductive layer through deposition with the use of a chemical vapor deposition (CVD) method, a physical vapor deposition (PVD) method or a sputtering method, applying a photosensitive layer onto the conductive layer, performing photolithography with the use of a mask so as to form a photosensitive layer pattern (not illustrated), and performing etching on the conductive layer with the use of the photosensitive layer pattern as an etching mask. The conductive layer may be formed as a multilayer film.

Figure 2:
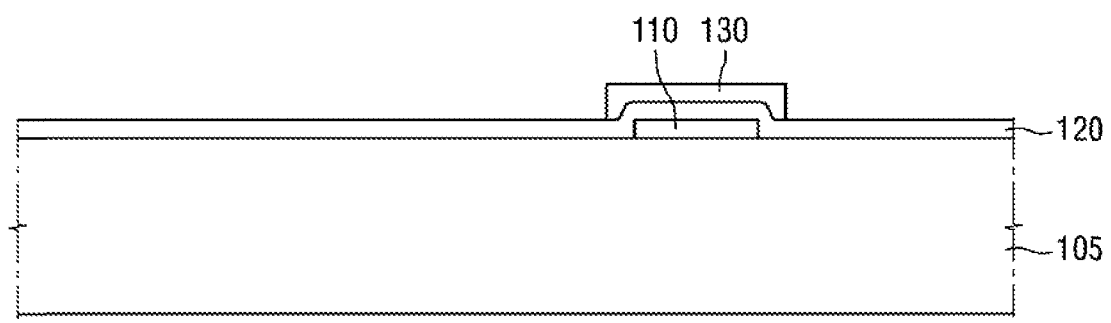

Referring to FIG. 2, a gate insulating layer 120 may be applied and formed on the entire surface of the substrate 105 where the gate line 115 and the gate electrode 110 are formed. The gate insulating layer 120 may be formed of an inorganic insulating material, including silicon oxide or silicon nitride.

A semiconductor layer 130 may be formed on the gate insulating layer 120. The semiconductor layer 130 may be disposed in an area that at least partially overlaps the gate electrode 110. The semiconductor layer 130 may be formed of amorphous silicon, polycrystalline silicon or an oxide semiconductor.

Figure 3:
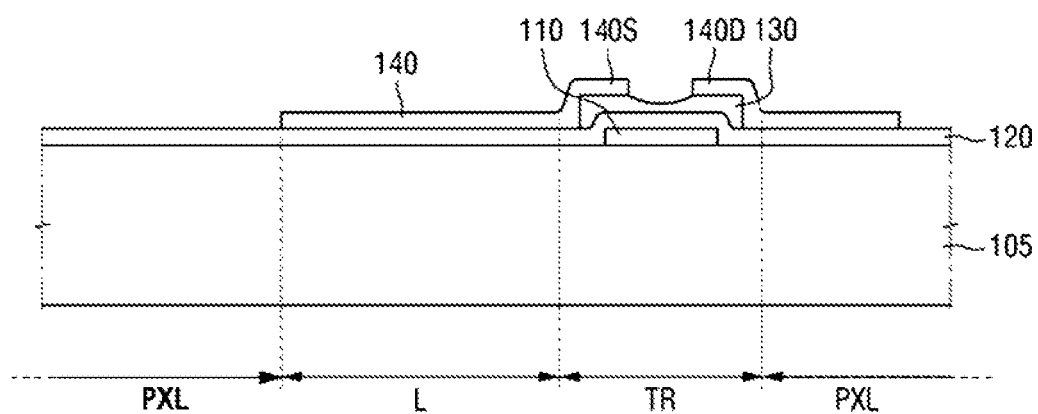

Referring to FIG. 3, a data line 140 and source and drain electrodes 140S and 140D which extend from, and are electrically connected to, the data line 140, may be formed on the gate insulating layer 120. The source and drain electrodes 140S and 140D and the data line 140 may be formed by forming a conductive layer on the gate insulating layer 120, applying a photosensitive layer, performing photolithography on the photosensitive layer with the use of a mask so as to form a photosensitive layer pattern, and performing etching on the conductive layer with the use of the photosensitive layer pattern as an etching mask.

Each region defined by the data line 140 and the gate line 115, which intersect each other, may be referred to as a pixel region PXL. A region where a thin-film transistor (TFT) including the source and drain electrodes 140S and 140D extended from the data line 140, the gate electrode 110 extended from the gate line 115, and the semiconductor layer 130 are formed may be defined as a transistor region TR. A region where the data line 140 and the gate line 115 are formed may be defined as a wiring region L.

Figure 4:
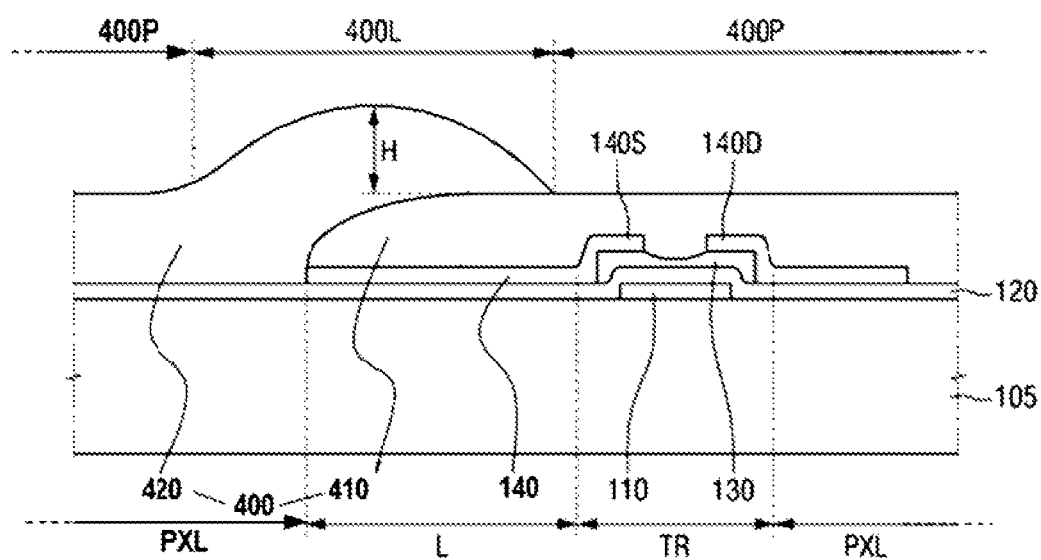

Referring to FIG. 4, color filters 400 of different colors may be repeatedly applied over the pixel region PXL. The color filters 400 may extend from the pixel region PXL to the wiring region L near the pixel region PXL. For example, color filters 400 of red, green and blue may be alternately arranged in the pixel region PXL.

More specifically, a first color filter 410, which is disposed in a first pixel region P1, may extend into the wiring region L, and a second color filter 420, which is applied over a second pixel region P2 near the first pixel region P1, may also extend into the same wiring region L. Accordingly, the first color filter 410 and the second color filter 420 may overlap each other in the wiring region L. Since the color filters 400 are formed to extend into the wiring region L and overlap each other in the wiring region L, the misalignment of the color filters 400 and the mixing of colors may be prevented, and as a result, the color reproducibility of the color filters 400 may be improved.

The first color filter 410 or the second color filter 420 is formed to spread so as to form a spread portion 400P over the pixel region PXL, and the first color filter 410 and the second color filter 420 are formed to overlap each other so as to form an overlapped portion 400L over the wiring region L.

The overlapped portion 400L where the first color filter 410 and the second color filter 420 overlap each other may have a predetermined height difference H relative to the spread portion 400P.

Figure 5:
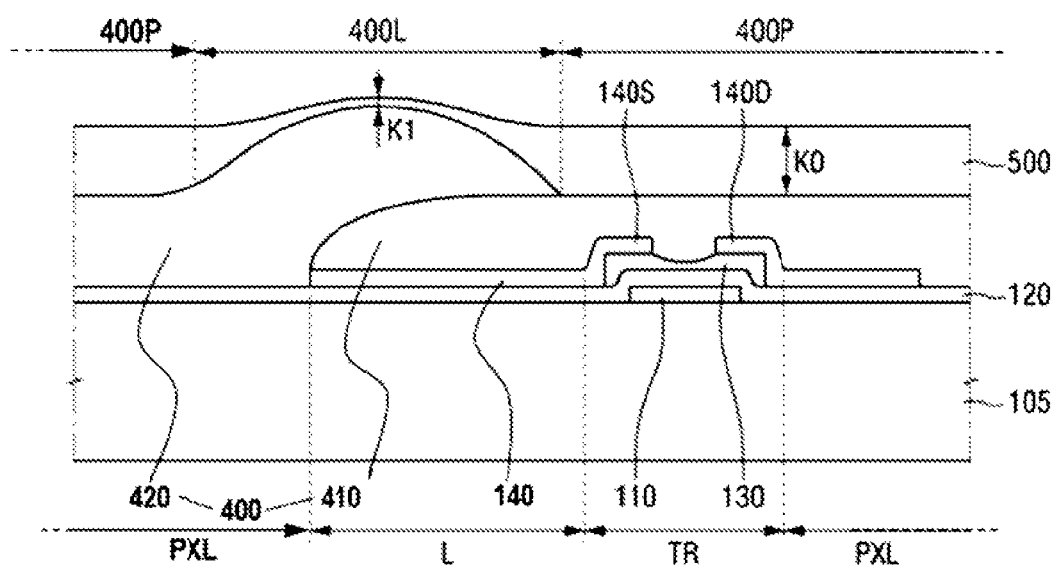

Referring to FIG. 5, a photoresist layer 500 may be applied and formed on the spread portion 400P and the overlapped portion 400L.

The photoresist layer 500 may be deposited to have different thicknesses on the spread portion 400P and the overlapped portion 400L by adjusting the amount of photoresist applied. In a case when an organic material such as photoresist is applied onto the surface of a structure with recesses and protrusions, the organic material may fill the recesses first, and may then be attached, at least partially, onto the surfaces of the protrusions due to the viscosity or viscous properties thereof. Accordingly, the photoresist layer 500 may be formed to have different thicknesses on the spread portion 400P and the overlapped portion 400L due to the height difference H formed between the spread portion 400P and the overlapped portion 400L.

The photoresist layer 500 may be formed to have a thickness K0 on the spread portion 400P, and may be formed to have a thickness K1, which is smaller than the thickness K0, on the overlapped portion 400L. Alternatively, the photoresist layer 500 may be formed to have such a thickness that the top portion of the overlapped portion 400L may be exposed. That is, a portion of the photoresist 500 at the top portion of the overlapped portion 400L having the thickness K1 may not be formed.

The thickness K0 of the photoresist layer 500 on a recessed portion, i.e., the spread portion 400P, may be greater than the thickness K1 of the photoresist layer 500 on a protruding portion, i.e., the overlapped portion 400P.

Figure 6:
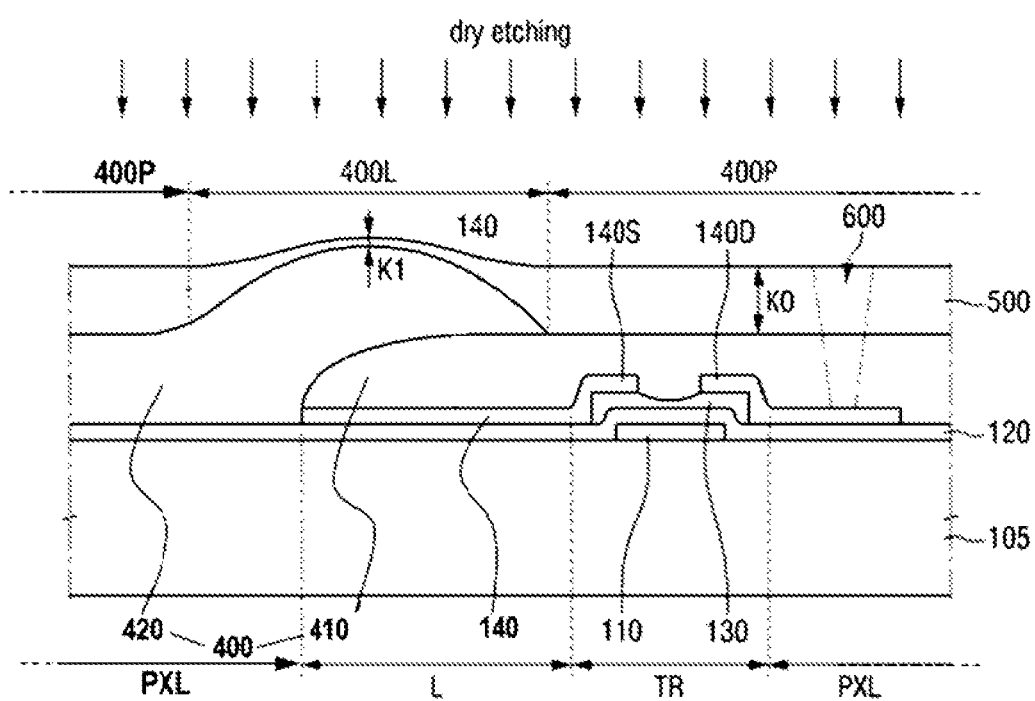

Referring to FIG. 6, a contact hole 600 may be formed by partially etching the photoresist layer 500 and the first color filter 410. The contact hole 600 may be formed through parts of the photoresist layer 500 and the first color filter 410 in an area corresponding to the drain electrode 140D.

The contact hole 600 may be formed by a dry etching method. The photoresist layer 500 may be divided into a cured region and a non-cured region through exposure to light. Due to the difference between the etching rates of the cured region and the non-cured region, the contact hole 600 may be formed in a particular region of the photoresist layer 500.

During the formation of the contact hole 600 by a dry etching method, part of the photoresist layer 500 around the contact hole 600 may be etched away due to plasma damage, and an upper part of the overlapped portion 400L of the color filters 400 may also be etched away due to the plasma damage.

Figure 7:
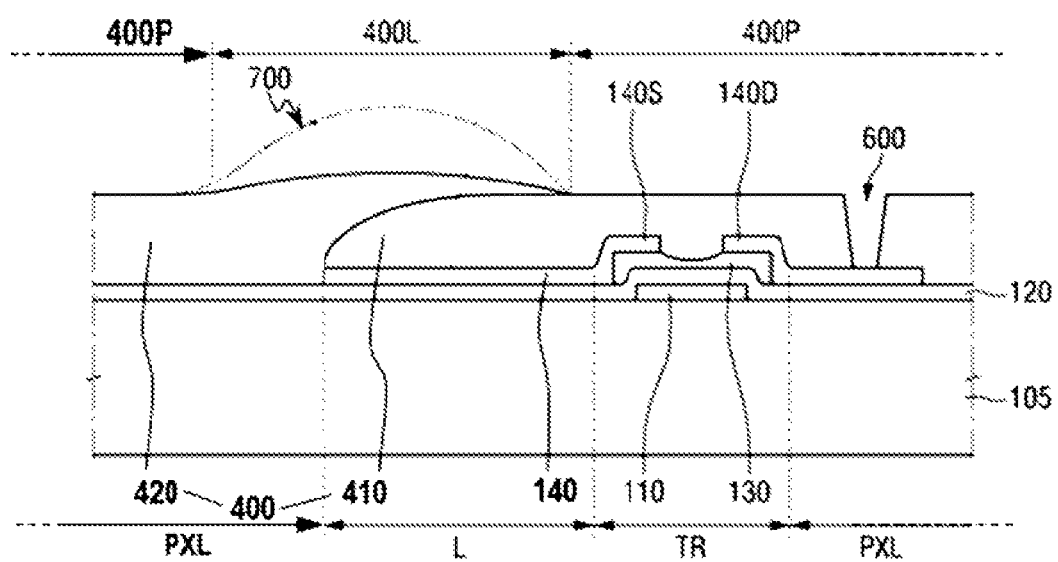

Referring to FIG. 7, the upper part of the overlapped portion 400L may be selectively etched while forming the contact hole 600 and would become etched-away part 700. The color filters 400 that include a part that would become the etched-away part 700, and the overlapped portion 400L may be formed of materials with similar or the same etching ratios for dry etching.

More specifically, if part of the photoresist layer 500 formed on the spread portion 400P is completely etched away by as much as the thickness K0 during the formation of the contact hole 600, then in the overlapped portion 400L, the photoresist layer 500, the color filter 420 if the photoresist layer 500 is not formed on the upper part of the overlapped portion 400L that would become the etched-away part 700, or both the photoresist layer 500 and the color filter 420 may be etched, and the etched thickness may be as much as the thickness K0.

That is, part of the photoresist layer 500 formed on the spread portion 400P with the thickness K1 and the top of the color filters 400 in the overlapped portion 400L, i.e., an upper part of the second color filter 420, may be etched away. As a result, a height difference between the first color filter 410 in the spread portion 400P and the second color filter 420 in the overlapped portion 400L may be reduced to be a "gentle" value.

For example, in a case when photoresist layer 500 is formed to have a thickness of about 1 μm on the color filters 400 and is applied onto the overlapped portion 400L such that the top of the first color filter 410 is almost exposed, the photoresist layer 500 may be etched away by as much as 0.7 μm not only from the spread portion 400P, but also from the overlapped portion 400L, by dry etching.

As a result, the upper part of the overlapped portion that would become the etched-away part 700 may have a thickness of about 0.5 μm to about 0.7 μm in the overlapped portion 400L. The upper part of the second color filter 420, which is disposed on the first color filter 410 in the overlapped portion 400L, may become the etched-away part 700.

The upper part of the second color filter 420 may be partially etched away, and as a result, the height difference between the spread portion 400P and the overlapped portion 400L may become less severe. The height difference between the overlapped portion 400L and the spread portion 400P may be reduced to 30% to 80% of the initial height difference H due to the etched-away part 700.

Figure 8:
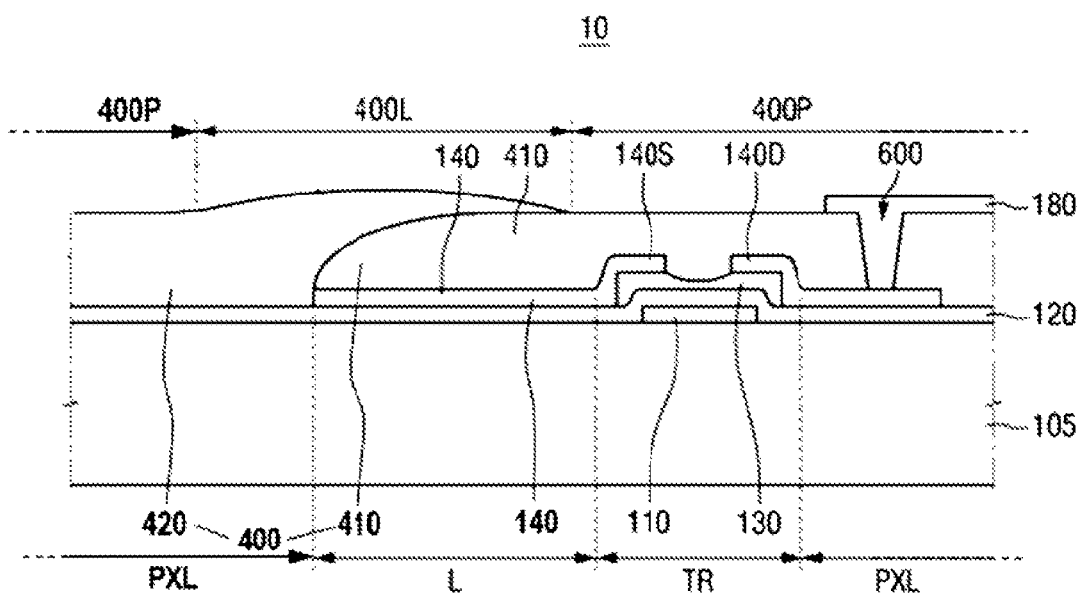

Referring to FIG. 8, a pixel electrode 180, which is connected to the drain electrode 140D, may be formed by depositing a conductive metal in an area where the contact hole 600 is formed. The pixel electrode 180 may be formed of a material such as indium tin oxide (ITO) or indium zinc oxide (IZO).

The method of manufacturing an array substrate 10, according to an exemplary embodiment of the invention, can secure a liquid crystal margin required for liquid crystal alignment and switching by minimizing the height difference between the overlapped portion 400L and the spread portion 400P without a requirement of an additional masking process. Accordingly, the injection of a liquid crystal material may be facilitated, and a liquid crystal material may be allowed to uniformly spread.

FIGS. 9 to 14 are cross-sectional views illustrating a method of manufacturing an array substrate, according to another exemplary embodiment of the invention. For convenience, the method of manufacturing an array substrate, according to another exemplary embodiment of the invention, will hereinafter be described with reference to FIGS. 9 to 14 and with further reference to FIGS. 1 to 8 and FIG. 21.

Figure 9:
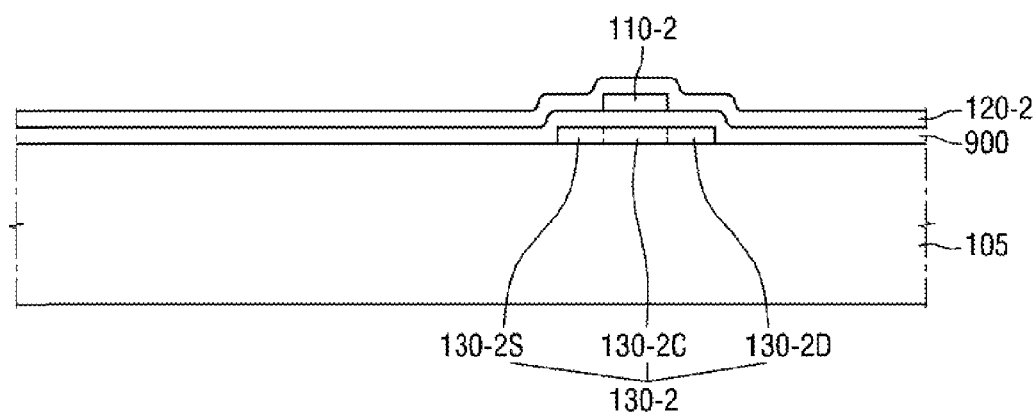
FIGS. 9 to 14 are cross-sectional views illustrating a method of manufacturing an array substrate, according to another exemplary embodiment of the invention.

Referring to FIG. 9, a semiconductor layer 130-2 may be formed on a substrate 105. The semiconductor layer 130-2 may be formed of amorphous silicon, polycrystalline silicon or an oxide semiconductor.

An insulating layer 900 may be formed on the entire surface of the substrate 105 where the semiconductor layer 130-2 is formed, and a gate electrode 110-2 and a gate line 115, which is electrically connected to the gate electrode 110-2, may be formed on the insulating layer 900 in an area that at least partially overlaps the semiconductor layer 130-2.

The semiconductor layer 130-2 may be divided into source and drain regions 130-2S and 130-2D and an active region 130-2C by implanting impurities into the semiconductor layer 130-2 with the use of the gate electrode 110-2 as a mask.

Figure 10:
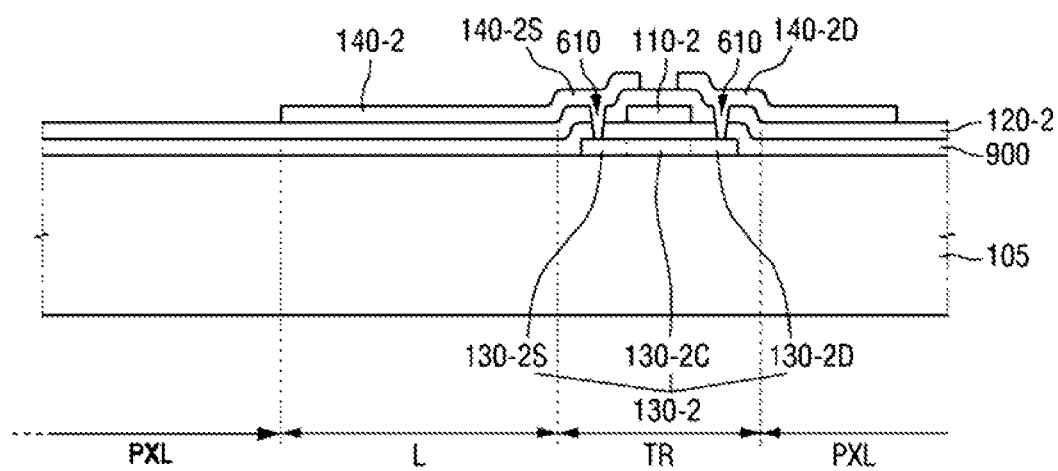

Referring to FIG. 10, first contact holes 610, which expose parts of the source and drain regions 130-2S and 130-2D therethrough, may be formed. A data line 140-2, which is connected to the semiconductor layer 130-2 through one of the first contact holes 610, may be formed. More specifically, a source electrode 140-2S, which is connected to the source region 130-2S through one of the first contact holes 610, may be formed, and a drain electrode 140-2D, which is connected to the drain region 130-2D, may be formed. The source electrode 140-2S may be formed in one body with the data line 140-2.

Figure 11:
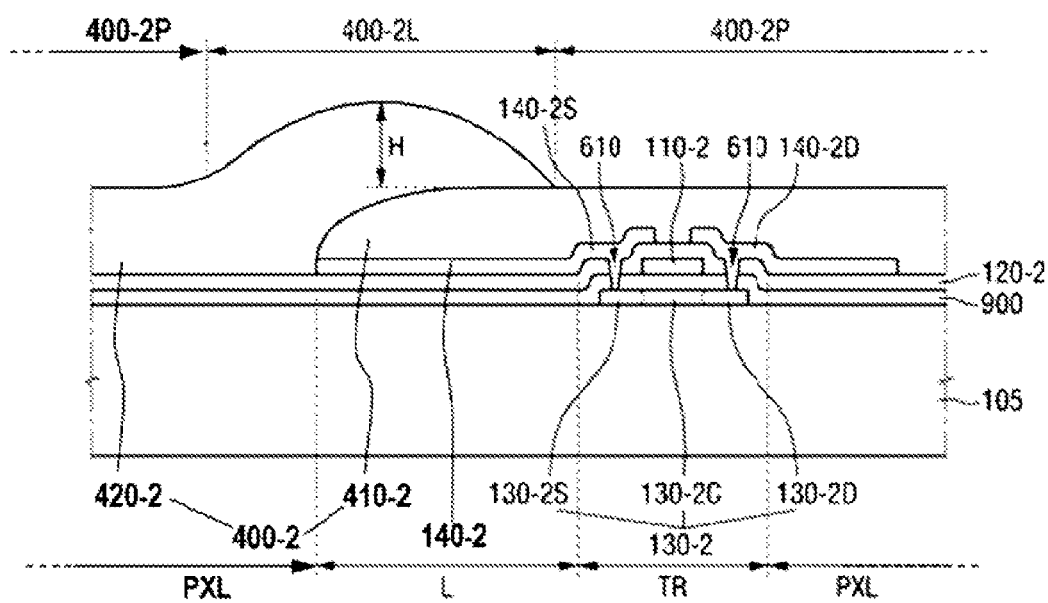

Referring to FIG. 11, color filters 400-2 of different colors may be repeatedly applied over a pixel region PXL. The color filters 400-2 may extend from the pixel region PXL to a wiring region L near the pixel region PXL. For example, color filters 400-2 of red, green and blue may be alternately arranged in the pixel region PXL.

More specifically, a first color filter 410-2, which is disposed in a first pixel region P1, may extend into the wiring region L, and a second color filter 420-2, which is applied over a second pixel region P2 near the first pixel region P1, may also extend into the wiring region L. Accordingly, the first color filter 410-2 and the second color filter 420-2 may overlap each other in the wiring region L. Since the color filters 400-2 are formed to extend into the wiring region L and overlap each other in the wiring region L, the misalignment of the color filters 400-2 and the mixing of colors may be prevented, and as a result, the color reproducibility of the color filters 400-2 may be improved.

A spread portion 400-2P where the first color filter 410-2 and the second color filter 420-2 are formed to spread may be formed over the pixel region PXL, and an overlapped portion 400-2L where the first color filter 410-2 and the second color filter 420-2 are formed to overlap each other may be formed over the wiring region L.

The overlapped portion 400-2L where the first color filter 410-2 and the second color filter 420-2 overlap each other may have a predetermined height difference H with the spread portion 400-2P.

Figure 12:
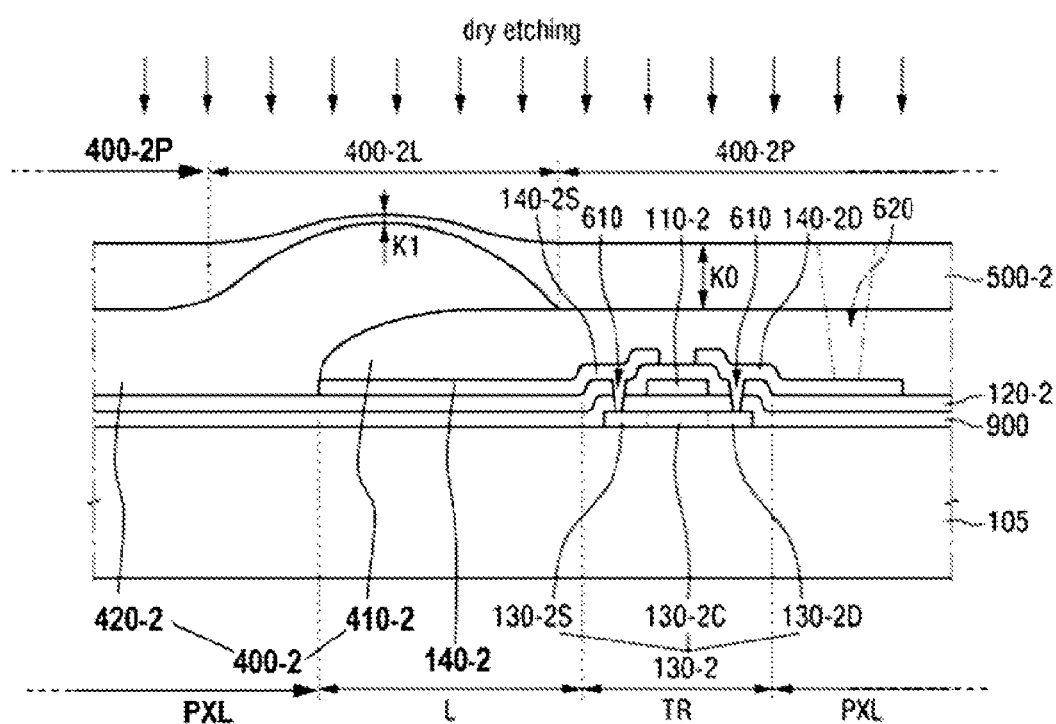

Referring to FIG. 12, a photoresist layer 500-2 may be applied and formed on the substrate 105 where the spread portion 400-2P and the overlapped portion 400-2L are formed.

The photoresist layer 500-2 may be deposited to different thicknesses on the spread portion 400-2P and the overlapped portion 400-2L by adjusting the amount of photoresist applied. In a case when an organic material such as photoresist is applied onto the surface of a structure with recesses and protrusions, the organic material may fill the recesses first and may then be attached, at least partially, onto the surfaces of the protrusions due to the viscosity or viscous properties of the organic material thereof. Accordingly, the photoresist layer 500-2 may be formed to have different thicknesses on the spread portion 400-2P and the overlapped portion 400-2L due to the height difference H formed between the spread portion 400-2P and the overlapped portion 400-2L.

The photoresist layer 500-2 may be formed to have a thickness K0 on the spread portion 400-2P, and may be formed to have a thickness K1, which is smaller than the thickness K0, on the overlapped portion 400-2L. Alternatively, the photoresist layer 500-2 may be formed to have such a thickness that the top of the overlapped portion 400-2L may be exposed. That is, the thickness K1 may not be formed.

The thickness K0 of the photoresist layer 500-2 on a recessed portion, i.e., the spread portion 400-2P, may be greater than the thickness K1 of the photoresist layer 500-2 on a protruding portion, i.e., the overlapped portion 400-2P.

A second contact hole 620 may be formed by partially etching the photoresist layer 500-2 and the first color filter 410-2. The second contact hole 620 may be formed through parts of the photoresist layer 500-2 and the first color filter 410-2 in an area corresponding to the drain electrode 140-2D.

The second contact hole 620 may be formed by a dry etching method. The photoresist layer 500-2 may be divided into a cured region and a non-cured region through exposure to light. Due to the difference between the etching rates of the cured region and the non-cured region, the second contact hole 620 may be formed in a particular region of the photoresist layer 500-2.

During the formation of the second contact hole 620 by a dry etching method, part of the photoresist layer 500-2 around the second contact hole 620 may be etched away due to plasma damage, and an upper part of the overlapped portion 400-2L of the color filters 400-2 may also be etched away due to the plasma damage.

Figure 13:
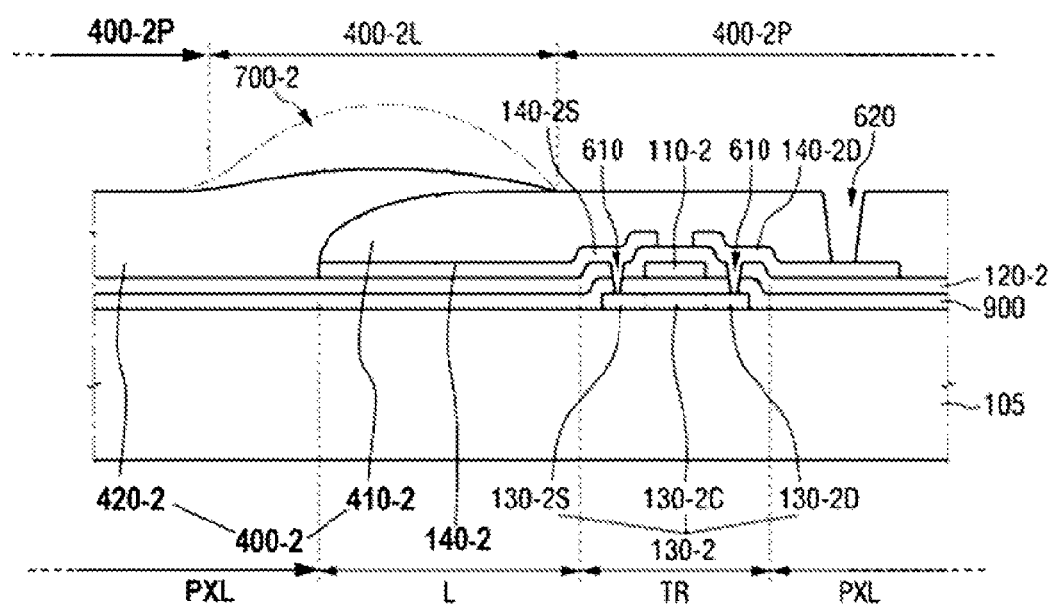

Referring to FIG. 13, the upper part of the overlapped portion 400-2L may be selectively etched while forming the second contact hole 620 and would become an etched-away part 700-2. The color filters 400-2 that include a part that would become the etched-away part 700-2, and the overlapped portion 400-2L may be formed of materials with similar or the same etching rates for dry etching.

More specifically, if part of the photoresist layer 500-2 formed on the spread portion 400-2P is completely etched away by as much as the thickness K0 during the formation of the second contact hole 620, at least one of the photoresist layer 500-2 and the color filters 400-2 may also be etched in the overlapped portion 400-2L by as much as the thickness K0.

That is, part of the photoresist layer 500-2 formed on the spread portion 400-2P with the thickness K1 and the top of some of the color filters 400-2 in the overlapped portion 400-2L, i.e., an upper part of the second color filter 420-2, may be etched away. As a result, a "gentle" height difference may be generated between the first color filter 410-2 in the spread portion 400-2P and the second color filter 420-2 in the overlapped portion 400-2L.

The upper part of the second color filter 420-2 may be partially etched away, and as a result, the height difference between the spread portion 400-2P and the overlapped portion 400-2L may become less severe. The height difference between the overlapped portion 400-2L and the spread portion 400-2P may be reduced to 30% to 80% of the initial height difference H due to the etched-away part 700-2.

Figure 14:
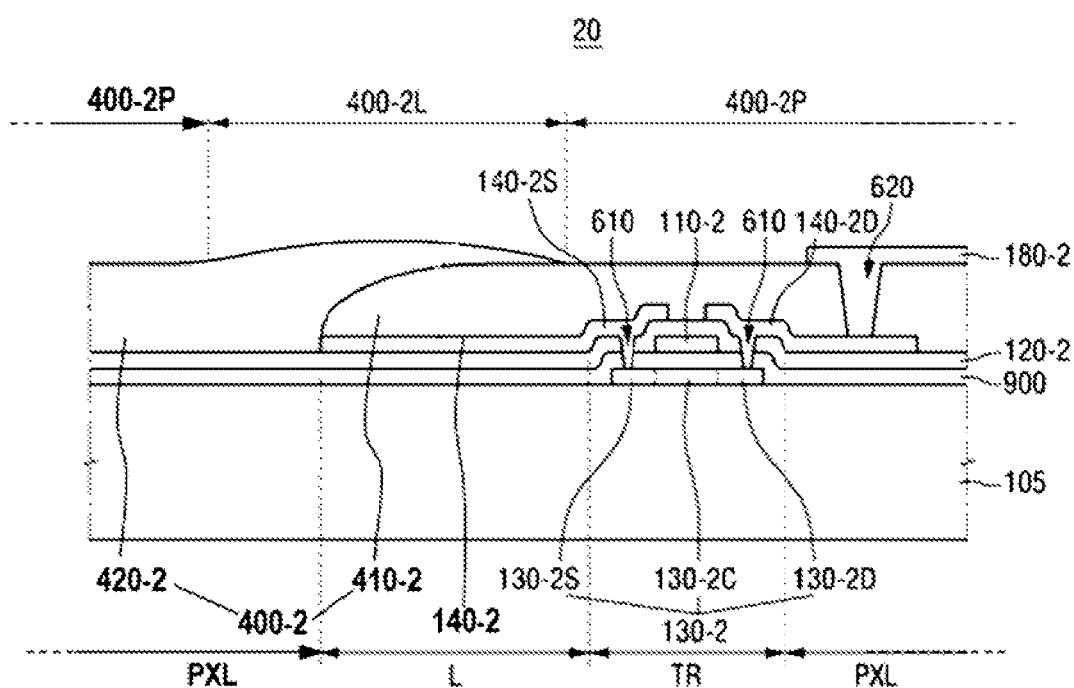

Referring to FIG. 14, a pixel electrode 180-2, which is connected to the drain electrode 140-2D, may be formed by depositing a conductive metal in an area where the second contact hole 620 is formed. The pixel electrode 180-2 may be formed of a material such as ITO or IZO.

The method of manufacturing an array substrate 20, according to an exemplary embodiment of the invention, can secure a liquid crystal margin by minimizing the height difference between the overlapped portion 400-2L and the spread portion 400-2P without a requirement of an additional masking process. Accordingly, the injection of a liquid crystal material may be facilitated, and a liquid crystal material may be allowed to uniformly spread.

FIGS. 15 to 20 are cross-sectional views illustrating a method of manufacturing an array substrate, according to another exemplary embodiment of the invention. For convenience, the method of manufacturing an array substrate, according to another exemplary embodiment of the invention, will hereinafter be described with reference to FIGS. 15 to 20 and with further reference to FIGS. 1 to 8 and FIG. 21.

Figure 15:
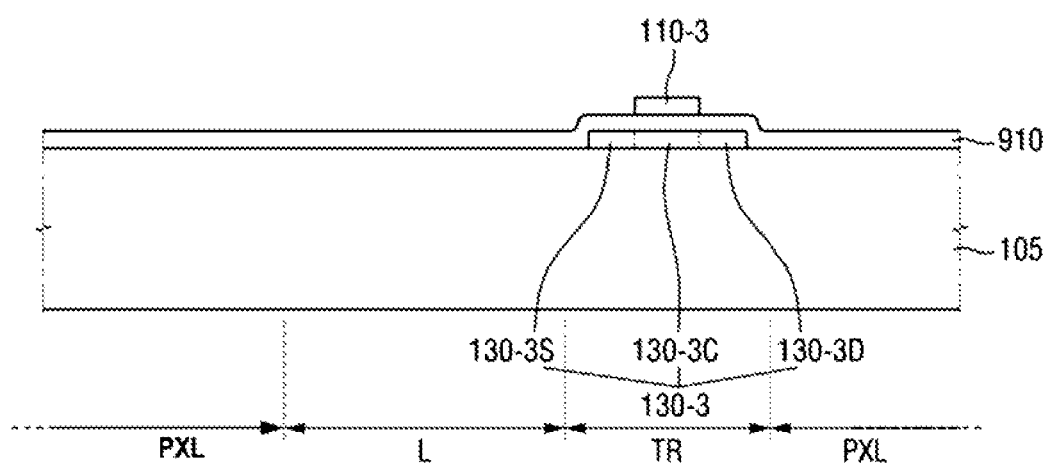
FIGS. 15 to 20 are cross-sectional views illustrating a method of manufacturing an array substrate, according to another exemplary embodiment of the invention.

Referring to FIG. 15, a semiconductor layer 130-3 may be formed on a substrate 105. The semiconductor layer 130-3 may be formed of amorphous silicon, polycrystalline silicon or an oxide semiconductor.

A first insulating layer 910 may be formed on the entire surface of the substrate 105 where the semiconductor layer 130-3 is formed, and a gate electrode 110-3 and a gate line 115, which is electrically connected to the gate electrode 110-3, may be formed on the first insulating layer 910 in an area that at least partially overlaps the semiconductor layer 130-3.

The semiconductor layer 130-3 may be divided into source and drain regions 130-3S and 130-3D and an active region 130-3C by implanting impurities into the semiconductor layer 130-3 with the use of the gate electrode 110-3 as a mask.

Figure 16:
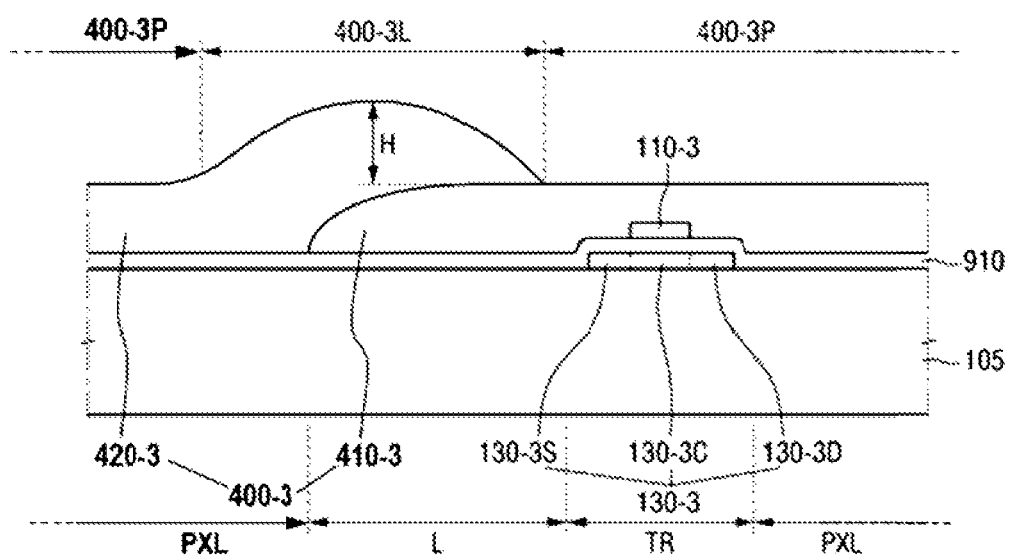

Referring to FIG. 16, color filters 400-3 of different colors may be repeatedly applied over a pixel region PXL. The color filters 400-3 may extend from the pixel region PXL to a wiring region L near the pixel region PXL. For example, color filters 400-3 of red, green and blue may be alternately arranged in the pixel region PXL.

The substrate 105 where the gate line 115 including the gate electrode 110-3 is formed may be divided into virtual regions, i.e., a transistor region TR where the semiconductor layer 130-3 and the gate electrode 110-3 are formed, the pixel region PXL where a pixel electrode 180-3 is to be formed, and the wiring region L where a data line 140-3 is to be formed.

A first color filter 410-3, which is disposed in a first pixel region P1, may extend into the wiring region L, and a second color filter 420-3, which is applied over a second pixel region P2 near the first pixel region P1, may also extend into the wiring region L. Accordingly, the first color filter 410-3 and the second color filter 420-3 may overlap each other in the wiring region L. Since the color filters 400-3 are formed to extend into the wiring region L and overlap each other in the wiring region L, the misalignment of the color filters 400-3 and the mixing of colors may be prevented, and as a result, the color reproducibility of the color filters 400-3 may be improved.

A spread portion 400-3P where the first color filter 410-3 and the second color filter 420-3 are formed to spread may be formed over the pixel region PXL, and an overlapped portion 400-3L where the first color filter 410-3 and the second color filter 420-3 are formed to overlap each other may be formed over the wiring region L.

The overlapped portion 400-3L where the first color filter 410-3 and the second color filter 420-3 overlap each other may have a predetermined height difference H with the spread portion 400-3P.

Figure 17:
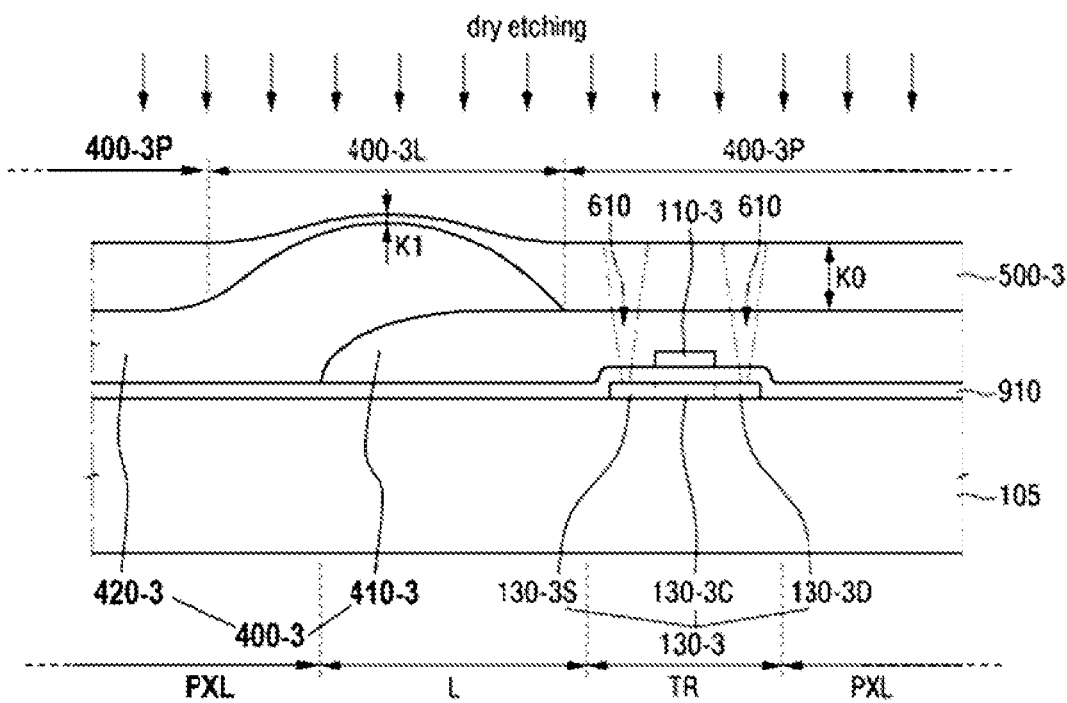

Referring to FIG. 17, a photoresist layer 500-3 may be applied and formed on the substrate 105 where the spread portion 400-3P and the overlapped portion 400-3L are formed.

The photoresist layer 500-3 may be deposited to different thicknesses on the spread portion 400-3P and the overlapped portion 400-3L by adjusting the amount of photoresist applied.

The photoresist layer 500-3 may be formed to have a thickness K0 on the spread portion 400-3P, and may be formed to have a thickness K1, which is smaller than the thickness K0, on the overlapped portion 400-3L. Alternatively, the photoresist layer 500-3 may be formed to have such a thickness that the top of the overlapped portion 400-3L may be exposed. That is, the thickness K1 may not be formed.

One or more first contact holes 610 may be formed by etching parts of the photoresist layer 500-3 and the first color filter 410-3. The first contact holes 610 may partially expose the source region 130-3S and the drain region 130-3D therethrough.

The first contact holes 610 may be formed by a dry etching method. The photoresist layer 500-3 may be divided into a cured region and a non-cured region through exposure to light. Due to the difference between the etching rates of the cured region and the non-cured region, the first contact holes 610 may be formed in a particular region of the photoresist layer 500-3.

During the formation of the first contact holes 610 by a dry etching method, parts of the photoresist layer 500-3 around the first contact holes 610 may be etched away due to plasma damage, and an upper part of the overlapped portion 400-3L of the color filters 400-3 may also be etched away due to the plasma damage.

Figure 18:
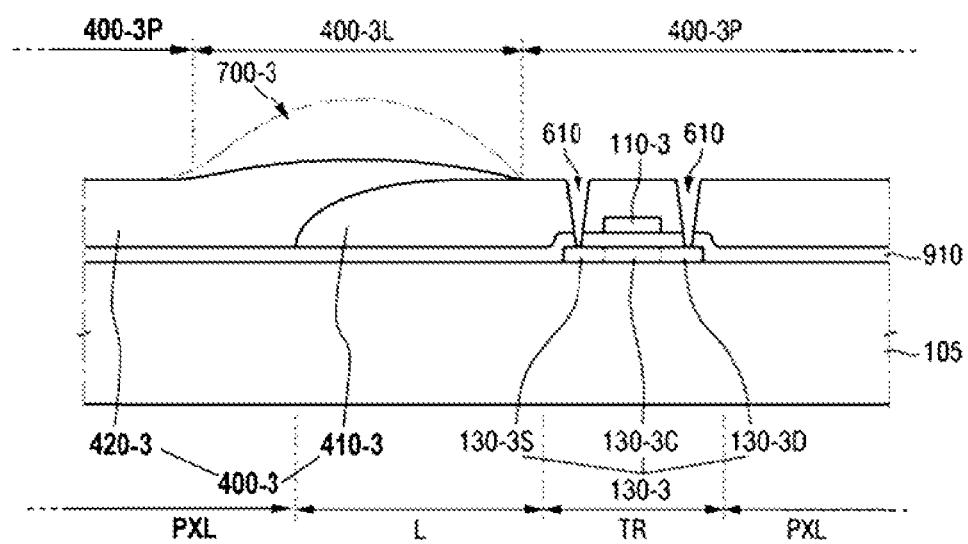

Referring to FIG. 18, the upper part of the overlapped portion 400-3L may be selectively etched during the formation of the first contact holes 610 and would become etched-away part 700-3. The color filters 400-3 that include the part that would become the etched-away part 700-3, and the overlapped portion 400-3L may be formed of materials with similar or the same etching rates for dry etching.

More specifically, if part of the photoresist layer 500-3 formed on the spread portion 400-3P is completely etched away by as much as the thickness K0 during the formation of the first contact holes 610, at least one of the photoresist layer 500-3 and the color filters 400-3 may also be etched in the overlapped portion 400-3L by as much as the thickness K0.

That is, part of the photoresist layer 500-3 formed on the spread portion 400-3P with the thickness K1 and the top of the color filters 400-3 in the overlapped portion 400-3L, i.e., an upper part of the second color filter 420-3, may be etched away. As a result, a "gentle" height difference may be generated between the first color filter 410-3 in the spread portion 400-3P and the second color filter 420-3 in the overlapped portion 400-3L.

The upper part of the second color filter 420-3 may be partially etched away, and as a result, the height difference between the spread portion 400-3P and the overlapped portion 400-3L may become less severe. The height difference between the overlapped portion 400-3L and the spread portion 400-3P may be reduced to 30% to 80% of the initial height difference H due to the etched-away part 700-3.

Figure 19:
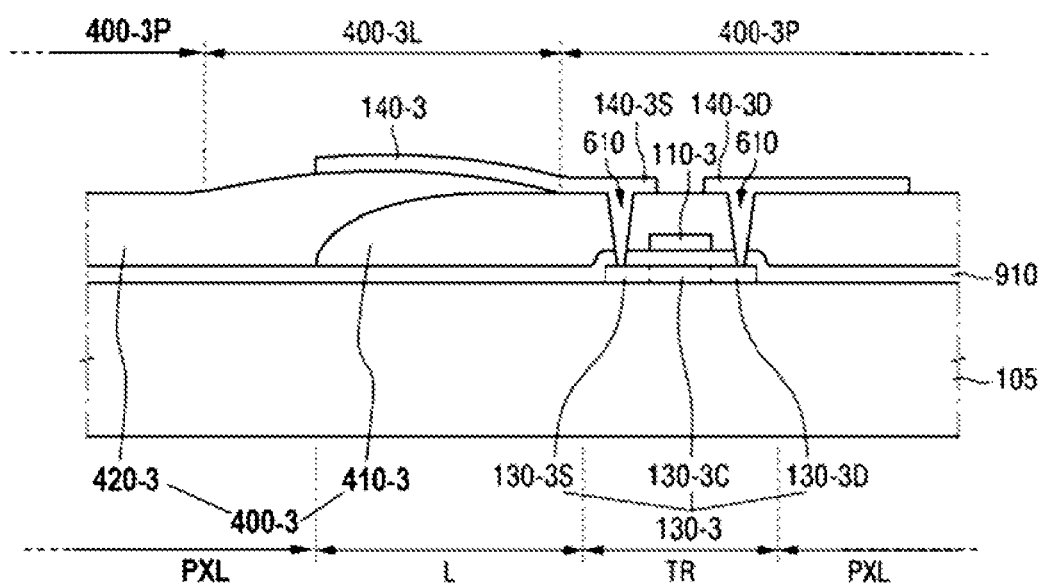

Referring to FIG. 19, the pixel electrode 180-3, which is connected to the semiconductor layer 130-3 through one of the first contact holes 610 that partially expose the source and drain regions 130-3S and 130-3D therethrough, may be formed. More specifically, a source electrode 140S, which is connected to the source region 130-3S via one of the first contact holes 610, may be formed and a drain electrode 140D, which is connected to the drain region 130-3D, may be formed. The source electrode 140S may be formed in one body with the data line 140-3.

Figure 20:
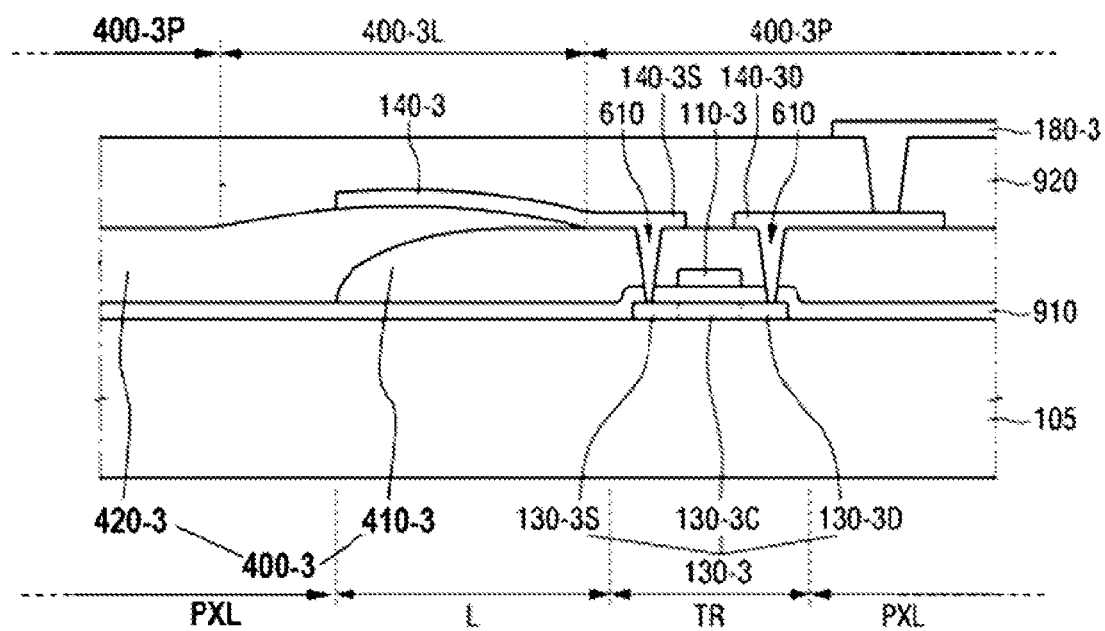

Referring to FIG. 20, a second insulating layer 920 is formed on the substrate 105 where the data line 140-3 including the source and drain electrodes 140-3S and 140-3D is formed, and a second contact hole 620 may be formed on the second insulating layer 920.

Since the pixel electrode 180-3 is to be disposed on the second insulating layer 920A, a flat surface is needed to be provided during the formation of the second insulating layer 920 to maintain a uniform cell gap in a liquid crystal layer between the pixel electrode 180-3 and opposing electrodes.

In a case when the second insulating layer 920 is formed on a surface with a height difference with the surroundings, such as the overlapped portion 400-3L, the second insulating layer 920 needs to be formed thick, and may not be free from thickness restrictions. More specifically, in response to an insulating material being applied onto a surface with recesses and protrusions, an insulating layer may become thick to fill the height difference between the recesses and the protrusions.

However, in the exemplary embodiment of FIGS. 15 to 20, the height difference between the overlapped portion 400-3L and the spread portion 400-3P may be minimized, and as a result, a "gentle" height difference may be formed. Accordingly, the second insulating layer 920 may be free from thickness restrictions.

The pixel electrode 180-3, which is connected to the drain electrode 140-3D, may be formed by depositing a conductive metal in an area where the second contact hole 620 is formed. The pixel electrode 180-3 may be formed of a material such as ITO or IZO.

The method of manufacturing an array substrate 30, according to an exemplary embodiment of the invention, can secure a liquid crystal margin by minimizing the height difference between the overlapped portion 400-3L and the spread portion 400-3P without a requirement of an additional masking process. Accordingly, the injection of a liquid crystal material may be facilitated, and a liquid crystal material may be allowed to uniformly spread. Also, the second insulating layer 920 may be free from thickness restrictions.

Figure 21:
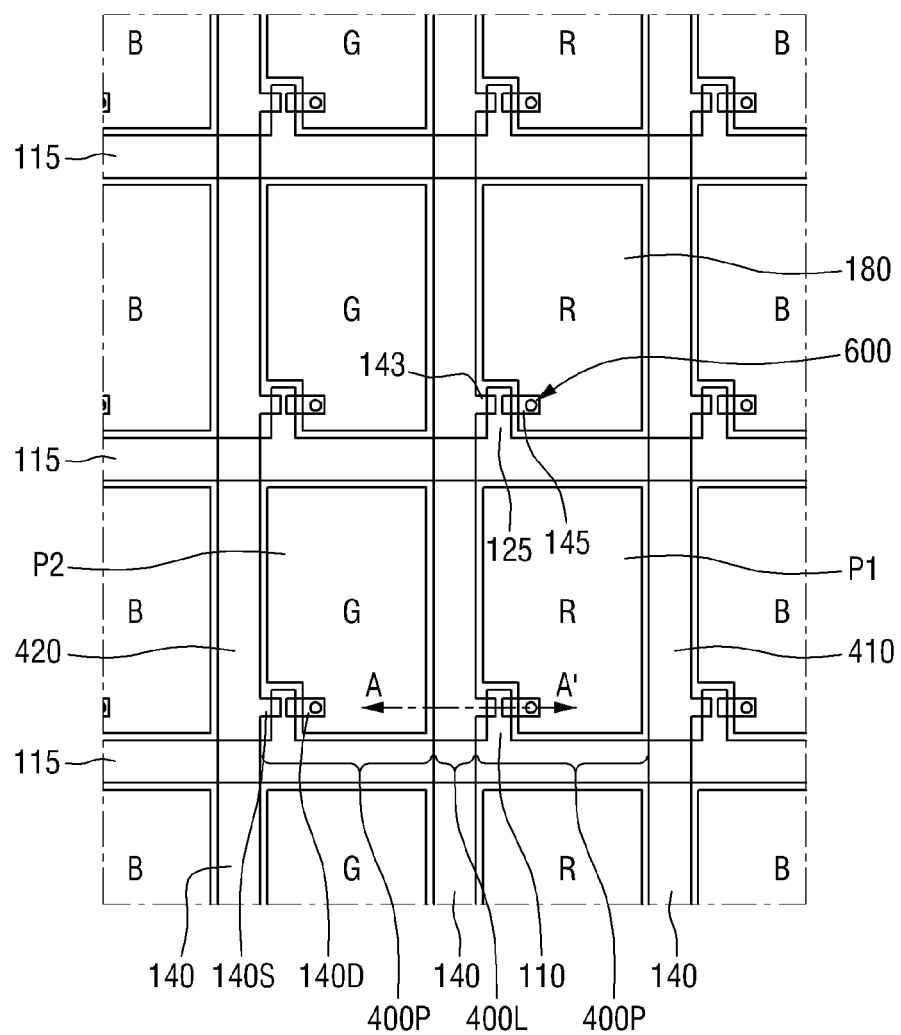
FIG. 21 is a plan view illustrating an array substrate according to an exemplary embodiment of the invention.
Figure 22:
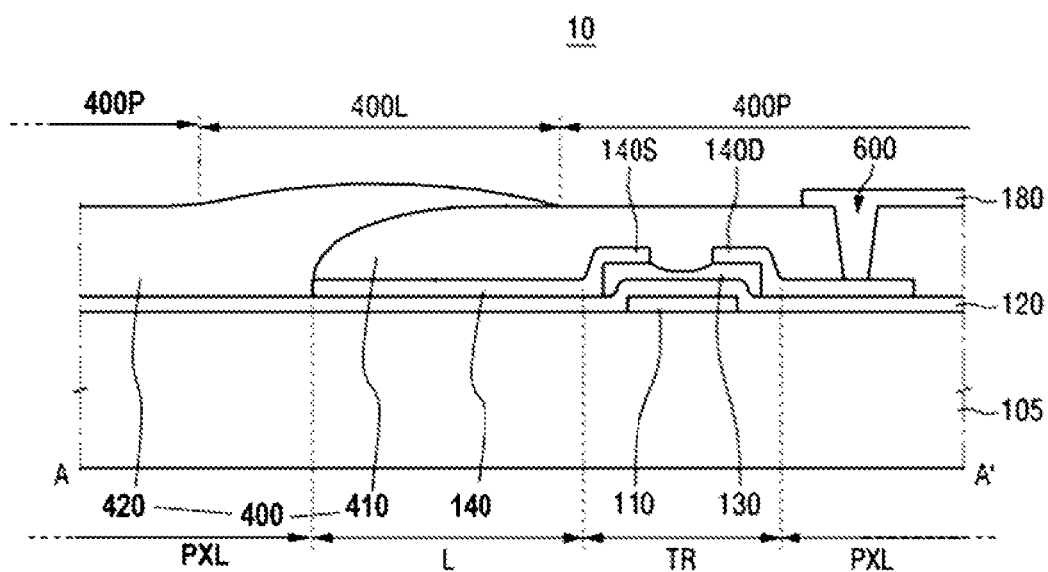
FIG. 22 is a cross-sectional view taken along line A-A' of FIG. 21.

FIG. 21 is a plan view illustrating an array substrate according to an exemplary embodiment of the invention, and FIG. 22 is a cross-sectional view taken along line A-A' of FIG. 21. The array substrate according to an exemplary embodiment of the invention will hereinafter be described with reference to FIGS. 21 and 22 and with further reference to FIGS. 1 to 8.

Referring to FIGS. 21 and 22, an array substrate 10 may include a substrate 105, a plurality of gate lines 115, which extend in a first direction on the substrate 105, a plurality of data lines 140, which extend in a second direction on the substrate 105, a plurality of TFTs, which are electrically connected to the gate lines 115 and the data lines 140, and a plurality of pixel regions PXL, which are defined by the gate lines 115 and the data lines 140.

A first color filter 410 may be disposed in a first pixel region P1, and a second color filter 420 may be disposed in a second pixel region P2 near the first pixel region p1. The first color filter 410 and the second color filter 420 may have an overlapped portion 400L at the boundary between the first pixel region P1 and the second pixel region P2, and may have different thicknesses from each other in the overlapped portion 400L.

More specifically, the array substrate 10 may include the substrate 105, which is a transparent insulating substrate, the gate lines 115, which extend in one direction on the substrate 105 and include a plurality of gate electrodes 110, and the data lines 140, which extend on the substrate 105 to intersect the gate lines 115 and include a plurality of source electrodes 140S and a plurality of drain electrodes 140D.

The array substrate 10 may include a plurality of transistor regions TR where the TFTs, which include the gate electrodes 110, respectively, that are formed at the intersections between the gate lines 115 and the data lines 140 and are electrically connected to the gate lines 115, and the source electrodes 140S, respectively, and the drain electrodes 140D, respectively, that are connected to the data line 140, are formed. The pixel regions PXL, which are defined by the data lines 140 and the gate lines 115, may be formed, and a plurality of wiring regions L where the data lines 140 and the gate lines 115 are formed, may be formed.

Each of the elements of the array substrate 10 will hereinafter be described in further detail with reference to FIG. 22. Referring to FIG. 22, the array substrate 10 may include color filters 400, which are formed on a gate insulating layer 120 where a TFT of a transistor region TR and a data line 140 are formed, and a pixel electrode 180, which is formed on the color filters 400 to be connected to a drain electrode 140D.

A gate electrode 110 may be formed on the substrate 105, and the gate insulating layer 120 may be formed on the entire surface 105 where the gate electrode 110 is formed. The gate insulating layer 120, which insulate the gate electrode 110, may be formed as a silicon oxide layer, a silicon nitride layer or a double layer thereof.

A semiconductor layer 130 may be formed on the gate insulating layer 120. The semiconductor layer 130 may at least partially overlap the gate electrode 110, or may be formed to completely overlap the whole gate electrode 110. The semiconductor layer 130 may be formed of amorphous silicon, polycrystalline silicon or an oxide semiconductor.

A source electrode 140S and the drain electrode 140D may be formed on the gate insulating layer 120 where the semiconductor layer 130 is formed. The source electrode 140S and the drain electrode 140D may be formed to at least partially overlap the semiconductor layer 130.

The array substrate 10 may form a TFT including the semiconductor layer 130, the gate electrode 110, the source electrode 140S and the drain electrode 140D, but the invention is not limited thereto. That is, various modifications may be made to the structure of a TFT without departing from the scope of the invention, as described above in the exemplary embodiments of FIGS. 9 to 14 and 15 to 20.

The color filters 400 may be disposed over a pixel region PXL and a wiring region L on the substrate 105 where the TFT is formed. The color filters 400 may be disposed over an area where the gate insulating layer 120 or the data line 140 and the TFT are formed.

The color filters 400 may include red, green, blue and white color filters. For a distinction between the color filters 400, which are of different colors, the color filters 400 may be referred to as the first color filter 410, the second color filter 420, and so forth. The color filters 400, which are of different colors, may be alternately arranged over the wiring region L and the pixel region PXL, overlapping each other in the wiring region L.

An overlapped portion 400L where the ends of the color filters 400 overlap each other may be formed in the wiring region L where the data line 140 is formed. Accordingly, color filters 400 of two or more colors may be arranged in the overlapped portion 400L. Alternatively, the color filters 400 may not overlap each other in the transistor region TR.

The first color filter 410 may be applied over the first pixel region P1 so as to form a spread portion 400P. The end of the first color filter 410, which is disposed in the first pixel region P1, may extend into the wiring region L. The second color filter 420, which is provided near the first color filter 410, may be applied over the second pixel region P2 so as to form the spread portion 400P.

The ends of the first color filter 410 and the second color filter 420 may extend into the wiring region L. Accordingly, the overlapped portion 400L where the ends of the first color filter 410 and the second color filter 420 overlap each other may be formed. Since the overlapped portion 400L where the color filters 400 overlap each other is disposed in the wiring region L, the misalignment of the color filters 400 and the mixing of colors may be prevented, and as a result, the color reproducibility of the color filters 400 may be improved.

The overlapped portion 400L where the ends of the color filters 400 overlap each other may have a height difference with the spread portion 400P. In a related-art liquid crystal display (LCD) device, a large height difference may be formed in the wiring region L, as illustrated in FIG. 4. However, such a large height difference may reduce a liquid crystal margin, and may thus prevent a liquid crystal material from uniformly spreading.

On the other hand, in the exemplary embodiment of FIGS. 21 and 22, the color filters 400 may be formed such that a thickness T1 of the color filters 400 in the spread portion 400P may be similar to a thickness T2 of the color filters 400 in the overlapped portion 400L. That is, the thickness T1 of the first color filter 410 and the second color filter 420 in the spread portion 400P may be similar to the thickness T2 of the first color filter 410 and the second color filter 420 combined in the overlapped portion 400L. Accordingly, the height of the first color filter 410 in the wiring region L1 may be minimized, and as a result, a height difference may be reduced.

A contact hole 600 may be provided on the color filters 400, and may connect the drain electrode 140D and the pixel electrode 180. In an exemplary embodiment, a common electrode may be formed on the color filters 400, a passivation layer may be formed on the substrate 105 where the common electrode is formed, so as to separate the common electrode from the pixel electrode 180, and the contact hole 600 may be formed through the passivation layer and the color filters 400.

The pixel electrode 180, which is connected to the drain electrode 140D through the contact hole 600, may be formed of a transparent conductive material, for example, ITO or IZO.

Since a surface with a gentle slope is formed by minimizing the height difference between the spread portion 400P and the overlapped portion 400L of the color filters 400, a cell gap margin may be secured for an LCD device using the array substrate 10, the injection of a liquid crystal material may be facilitated, and the uniformity of the spread of the liquid crystal material may be improved.

Figure 23:
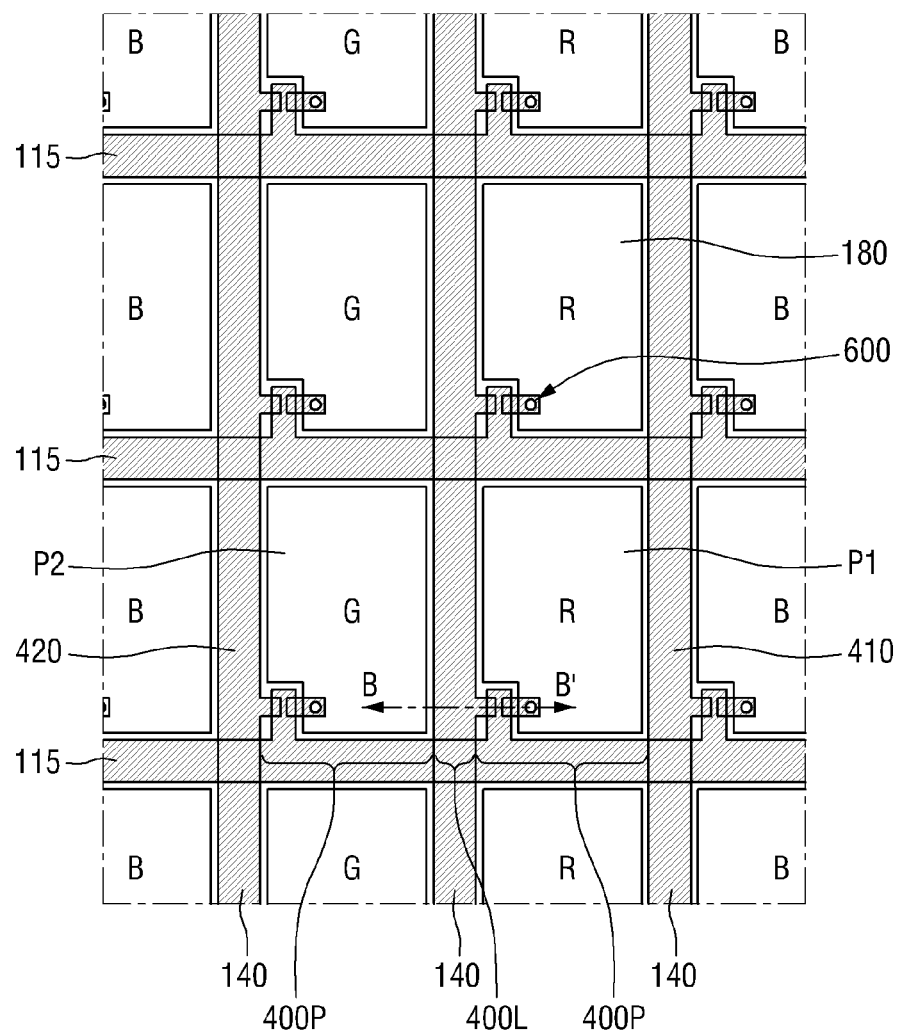
FIG. 23 is a plan view illustrating a liquid crystal display (LCD) device including an array substrate according to another exemplary embodiment of the invention.
Figure 24:
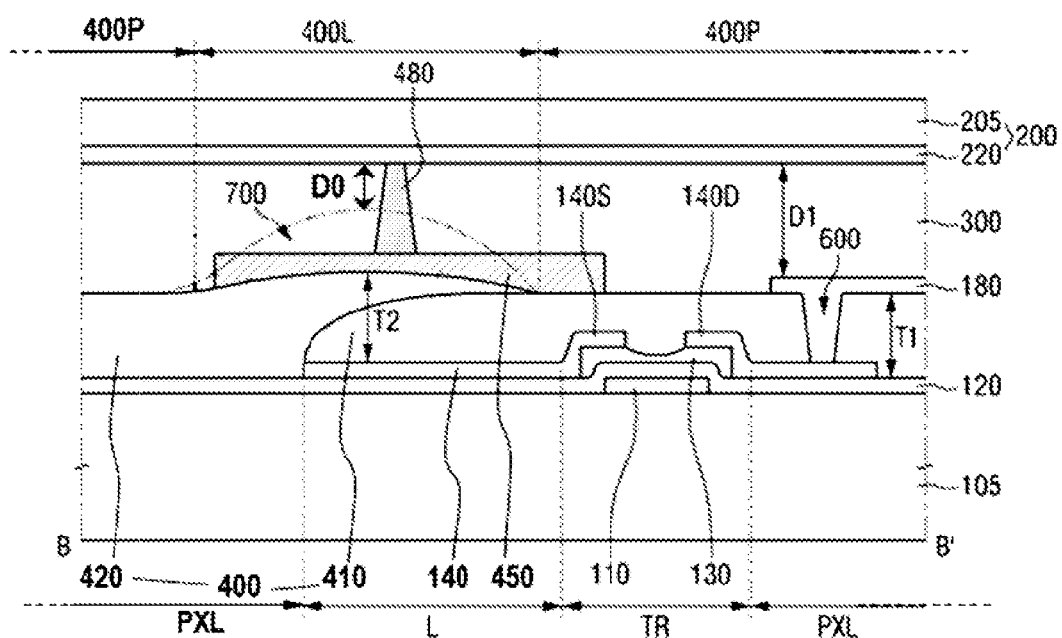
FIG. 24 is a cross-sectional view taken along line B-B' of FIG. 23.
Figure 25:
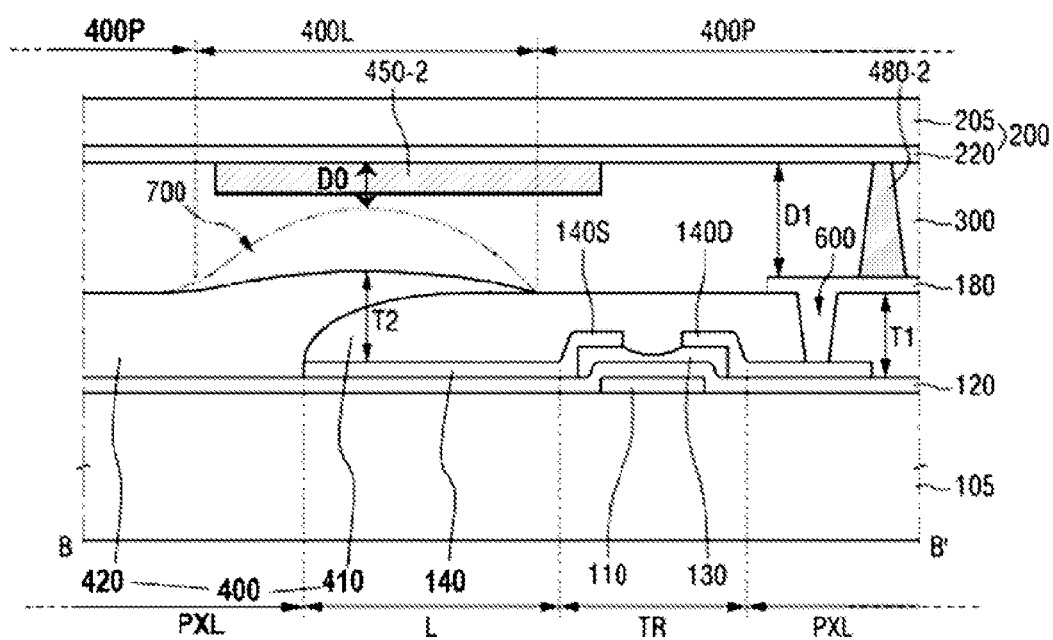
FIG. 25 is a cross-sectional view illustrating an LCD device including an array substrate according to another exemplary embodiment of the invention.

FIG. 23 is a plan view illustrating an LCD device including an array substrate according to another exemplary embodiment of the invention, FIG. 24 is a cross-sectional view taken along line B-B' of FIG. 23, and FIG. 25 is a cross-sectional view illustrating an LCD device including an array substrate according to another exemplary embodiment of the invention. For convenience, the array substrates according to other exemplary embodiment of the invention will be described with reference to FIGS. 22 to 25 and with further reference to FIGS. 21 and 22.

Referring to FIGS. 23 and 24, an LCD device 1 may include an array substrate 10, an opposing substrate 200, which faces the array substrate 10, and a liquid crystal layer 300, which is interposed between the array substrate 10 and the opposing substrate 200. Each of the array substrate 10 and the opposing substrate 200 may include a substrate, which is disposed at the bottom or the top of the LCD device 1. The substrate used in the array substrate 10 will hereinafter be referred to as a lower substrate 105, and the substrate used in the opposing substrate 200 will hereinafter be referred to as an upper substrate 205. The lower substrate 105 and the upper substrate 205 may be formed of an insulating material or a transparent material such as glass or a plastic material. The opposing substrate 200 may include an opposing electrode 220, which is formed on the upper substrate 205.

A black matrix 450 may be disposed in an area corresponding to a wiring region L of the array substrate 10. The black matrix 450 may also be disposed in a transistor region TR. The black matrix 450 may be formed to be larger than wiring to prevent the mixing of colors and to block the transmission of light.

A column spacer 480 may be disposed on the black matrix 450 to maintain the cell gap between the array substrate 10 and the opposing substrate 200. The column spacer 480 and the black matrix 450 may be formed of the same material by the same process.

In a related-art LCD device, since a large height difference is formed between the overlapped portion 400L and the spread portion 400P, a cell gap margin may not be properly secured. As a result, it is difficult to inject a liquid crystal material, and the liquid crystal material may not be able to uniformly spread. That is, since a cell gap D1, i.e. a minimum distance between the pixel electrode 180 and the opposing substrate 220, and a cell gap D0, i.e. a minimum distance between the etched-away part 700 and the opposing substrate 220, are formed on the spread portion 400P and the overlapped portion 400L, respectively, the injection of a liquid crystal material and the spread of the liquid crystal material may both be interfered with due to a large cell gap difference between the overlapped portion 400L and the spread portion P.

On the other hand, in the LCD device 1, the color filters 400 are partially etched in the overlapped portion 400L, thereby reducing the height difference H between the overlapped portion 400L and the spread portion 400P. Since the upper part of the second color filter 420 is etched away, a "gentle" height difference may be generated between the spread portion 400P and the overlapped portion 400L. Accordingly, the height difference between the overlapped portion 400L and the spread portion 400P may be reduced to 30% to 80% of the initial height difference H due to the etched-away part 700.

That is, the overlapped portion 400L and the spread portion 400P may be formed to similar thicknesses, i.e., the thicknesses T1 and T2 may be similar to each other. The thickness T1 of the overlapped portion 400L may be 10% to 30% greater than the thickness T2 of the spread portion 400P.

Accordingly, the cell gap D1 in the spread portion 400P and the cell gap D2 in the overlapped portion 400L may become similar to each other, and a cell gap margin (D1 D2) may be secured between the array substrate 10 and the opposing substrate 200. As a result, the injection of a liquid crystal material may be facilitated, and the uniformity of the spread of the liquid crystal material may be improved.

In short, a gentle height difference may be generated between the overlapped portion 400L and the spread portion 400P of the color filters 400 so as to secure a liquid crystal margin. Accordingly, even with the application of the column spacer 480 to the black matrix 450, the injection of a liquid crystal material may be facilitated, and the uniformity of the spread of the liquid crystal material may be improved.

Referring to FIG. 25, a black matrix 450-2 may be disposed on the opposing substrate 200. More specifically, an opposing electrode 220 may be disposed on an upper substrate 205, and the black matrix 450-2 may be disposed on the opposing electrode 220 at a location corresponding to a wiring region L on an array substrate 10. Since the black matrix 450-2 is disposed on the opposing substrate 200, the fabrication of an LCD device may be facilitated, as compared to a case when the black matrix 450-2 is formed on the array substrate 10.

A color spacer 480-2 for maintaining a cell gap may be disposed on a spread portion 400P in a pixel region PXL. The column spacer 480-2 may be formed of a transparent material in the pixel region PXL, which transmits light therethrough to represent colors.

Accordingly, a height difference H between the overlapped portion 400L and the spread portion P may be gently reduced. Also, it is possible to secure a large cell gap in the overlapped portion 400L by providing a transparent column spacer 480-2 in the spread portion 400P where there is a relatively sufficient cell gap margin.

While the invention has been particularly shown and described with reference to exemplary embodiments thereof, it will be understood by those of ordinary skill in the art that various changes in provide and detail may be made therein without departing from the spirit and scope of the invention as defined by the following claims. The exemplary embodiments should be considered in a descriptive sense only and not for purposes of limitation.

What is claimed is:

1. A method of manufacturing an array substrate, which includes, on a substrate, a plurality of gate lines that extend in a first direction, a plurality of data lines that extend in a second direction, and a plurality of pixel regions that are defined by the plurality of gate lines and the plurality of data lines, the method comprising:
   forming a gate electrode and a gate line, which is electrically connected to the gate electrode, on the substrate;
   forming a gate insulating layer on an entire surface of the substrate where the gate line is formed;
   forming a semiconductor layer on the gate insulating layer in an area that at least partially overlaps the gate electrode;
   forming a data line, which includes source and drain electrodes that at least partially overlap the semiconductor layer and is electrically connected to the source and drain electrodes;
   applying a first color filter over a first pixel region on the substrate where the data line is formed and applying a second color filter over a second pixel region that is near the first pixel region; and
   forming a contact hole, which partially exposes the drain electrode therethrough, by etching at least one of the first color filter and the second color filter,
   wherein the first color filter and the second color filter have an overlapped portion, which is relatively thick at the boundary between the first pixel region and the second pixel region, and an overall thickness of the overlapped portion is reduced by the forming the contact hole includes selectively etching an upper part of the overlapped portion.

2. The method of claim 1, wherein the forming the contact hole further includes forming a photoresist layer on the substrate where the first color filter and the second color filter are formed, and the photoresist layer is relatively thinner on the overlapped portion than on the first color filter in the first pixel region or on the second color filter in the second pixel region.

3. The method of claim 1, wherein the first color filter and the second color filter are of different colors.

4. The method of claim 1, further comprising:
   forming a pixel electrode, which is connected to the drain electrode through the contact hole, on at least one of the first color filter and the second color filter.

5. The method of claim 2, wherein the forming the contact hole includes selectively etching the upper part of the overlapped portion with the use of a dry etching method.

6. A method of manufacturing an array substrate, which includes, on a substrate, a plurality of gate lines that extend in a first direction, a plurality of data lines that extend in a second direction, and a plurality of pixel regions that are defined by the plurality of gate lines and the plurality of data lines, the method comprising:
   forming a semiconductor layer on the substrate;
   forming an insulating layer on the substrate where the semiconductor layer is formed;
   forming a gate electrode and a gate line, which is electrically connected to the gate electrode, on the insulating layer in an area that at least partially overlaps the semiconductor layer;
   forming a gate insulating layer on an entire surface of the substrate where the gate line is formed;
   forming at least one first contact hole, which at least partially exposes the semiconductor layer therethrough, by etching the gate insulating layer and the insulating layer;
   forming a data line, which includes source and drain electrodes that are connected to the semiconductor layer, on the gate insulating layer where the first contact hole is formed;
   applying a first color filter over a first pixel region on the substrate where the data line is formed and applying a second color filter over a second pixel region that is near the first pixel region; and
   forming a second contact hole, which partially exposes the drain electrode therethrough, by etching at least one of the first color filter and the second color filter,
   wherein the first color filter and the second color filter have an overlapped portion, which is relatively thick at the boundary between the first pixel region and the second pixel region, and an overall thickness of the overlapped portion is reduced by the forming the second contact hole includes selectively etching an upper part of the overlapped portion.

7. The method of claim 6, wherein the forming the second contact hole further includes forming a photoresist layer on the substrate where the first color filter and the second color filter are formed, and the photoresist layer is relatively thinner on the overlapped portion than on the first color filter in the first pixel region or on the second color filter in the second pixel region.

8. The method of claim 6, wherein the first color filter and the second color filter are of different colors.

9. The method of claim 6, further comprising:
   forming a pixel electrode, which is connected to the drain electrode through the second contact hole, on at least one of the first color filter and the second color filter.

10. The method of claim 7, wherein the forming the second contact hole includes selectively etching the upper part of the overlapped portion with the use of a dry etching method.

11. A method of manufacturing an array substrate, which includes, on a substrate, a plurality of gate lines that extend in a first direction, a plurality of data lines that extend in a second direction, and a plurality of pixel regions that are defined by the plurality of gate lines and the plurality of data lines, the method comprising:

forming a semiconductor layer on the substrate;

forming a first insulating layer on the substrate where the semiconductor layer is formed;

forming a gate electrode and a gate line, which is electrically connected to the gate electrode, on the first insulating layer in an area that at least partially overlaps the semiconductor layer;

applying a first color filter over a first pixel region on the substrate where the gate electrode and the gate line are formed and applying a second color filter over a second pixel region that is near the first pixel region;

forming at least one first contact hole, which partially exposes the semiconductor layer therethrough, by etching at least one of the first color filter and the second color filter; and forming a data line, which includes source and drain electrodes that are connected to the semiconductor layer through the first contact hole, on at least one of the first color filter and the second color filter, wherein the first color filter and the second color filter have an overlapped portion, which is relatively thick at the boundary between the first pixel region and the second pixel region, and an overall thickness of the overlapped portion is reduced by the forming the first contact hole includes selectively etching an upper part of the overlapped portion.

12. The method of claim 11, wherein the forming the first contact hole further includes forming a photoresist layer on the substrate where the first color filter and the second color filter are formed, and the photoresist layer is relatively thinner on the overlapped portion than on the first color filter in the first pixel region or on the second color filter in the second pixel region.

13. The method of claim 11, wherein the first color filter and the second color filter are of different colors.

14. The method of claim 11, further comprising:

forming a second insulating layer on the entire surface of the substrate where the data line is formed;

forming a second contact hole, which partially exposes the drain electrode therethrough, on the second insulating layer; and forming a pixel electrode, which is connected to the drain electrode through the second contact hole.

15. The method of claim 12, wherein the forming the first contact hole includes selectively etching the upper part of the overlapped portion with the use of a dry etching method.

16. An array substrate, comprising:

a substrate;

a plurality of gate lines extended in a first direction on the substrate;

a plurality of data lines extended in a second direction on the substrate;

a plurality of thin-film transistors (TFTs) having a source electrode and a drain electrode being electrically connected to the gate lines and the data lines; and a plurality of pixel regions defined by the gate lines and the data lines, wherein a first color filter is disposed in a first pixel region, a second color filter is disposed in a second pixel region near the first pixel region, and the first color filter and the second color filter have an overlapped portion at the boundary between the first pixel region and the second pixel region, and an overall thickness of the overlapped portion is reduced by having the first and second color filters that have different thicknesses from each other in the overlapped portion.

17. The array substrate of claim 16, wherein the overlap portion is 10% to 30% thicker than a spread portion of one of the first color filter and the second color filter.

18. The array substrate of claim 16, wherein the TFTs are of a bottom gate type and the first color filter and the second color filter are disposed between one of the data lines and a pixel electrode.

19. The array substrate of claim 16, wherein the TFTs are of a top gate type and the first color filter and the second color filter are disposed between one of the data lines and a pixel electrode.

20. The array substrate of claim 16, wherein the TFTs are of a top gate type and the first color filter and the second color filter are disposed between one of the gate lines and one of the data lines.

* * * * *